United States Patent
Tai et al.

(10) Patent No.: US 8,058,687 B2
(45) Date of Patent: Nov. 15, 2011

(54) SPLIT GATE WITH DIFFERENT GATE MATERIALS AND WORK FUNCTIONS TO REDUCE GATE RESISTANCE OF ULTRA HIGH DENSITY MOSFET

(75) Inventors: Sung-Shan Tai, San Jose, CA (US); YongZhong Hu, Cupertino, CA (US)

(73) Assignee: Alpha & Omega Semiconductor, Ltd. (BM)

( * ) Notice: Subject to any disclaimer, the term of this patent is extended or adjusted under 35 U.S.C. 154(b) by 687 days.

(21) Appl. No.: 11/700,688

(22) Filed: Jan. 30, 2007

(65) Prior Publication Data

US 2008/0179668 A1 Jul. 31, 2008

(51) Int. Cl.
*H01L 29/66* (2006.01)
(52) U.S. Cl. .................. 257/332; 257/E21.428; 438/270
(58) Field of Classification Search .................. 257/330, 257/331, 302, 500, 77
See application file for complete search history.

(56) References Cited

U.S. PATENT DOCUMENTS

| 4,672,246 | A  | * | 6/1987 | Donovan ...................... 327/436 |
| 5,592,005 | A  |   | 1/1997 | Floyd et al. |
| 6,225,161 | B1 | * | 5/2001 | Liu et al. ...................... 438/259 |
| 2002/0056874 | A1 |   | 5/2002 | Ohtake et al. |
| 2003/0146479 | A1 |   | 8/2003 | Barnak et al. |
| 2004/0031987 | A1 | * | 2/2004 | Henninger et al. ........... 257/328 |
| 2004/0232450 | A1 |   | 11/2004 | Yilmaz |
| 2005/0104093 | A1 | * | 5/2005 | Yoshimochi .................. 257/224 |
| 2006/0118835 | A1 |   | 6/2006 | Ellis-Monaghan et al. |
| 2006/0273379 | A1 |   | 12/2006 | Bhalla et al. |
| 2006/0273382 | A1 | * | 12/2006 | Hshieh .......................... 257/330 |

* cited by examiner

*Primary Examiner* — Marcos D. Pizarro
*Assistant Examiner* — Eva Yan Montalvo
(74) *Attorney, Agent, or Firm* — Bo-In Lin

(57) ABSTRACT

This invention discloses a trenched metal oxide semiconductor field effect transistor (MOSFET) cell. The trenched MOSFET cell includes a trenched gate opened from a top surface of the semiconductor substrate surrounded by a source region encompassed in a body region above a drain region disposed on a bottom surface of a substrate. The trenched gate further includes at least two mutually insulated trench-filling segments each filled with materials of different work functions. In an exemplary embodiment, the trenched gate includes a polysilicon segment at a bottom portion of the trenched gate and a metal segment at a top portion of the trenched gate.

14 Claims, 6 Drawing Sheets

SPLIT GATE WITH DIFFERENT GATE MATERIALS AND WORK FUNCTIONS TO REDUCE GATE RESISTANCE OF ULTRA HIGH DENSITY MOSFET

BACKGROUND OF THE INVENTION

1. Field of the Invention

The invention relates generally to the semiconductor power devices. More particularly, this invention relates to an improved and novel manufacturing process and device configuration for providing the split trench gates having reduced gate resistance Rg and different work functions of the top and bottom portions of the trench gate for more flexible performance and functional adjustments.

2. Description of the Prior Art

Conventional processes for manufacturing semiconductor power devices with metal gate are often limited by one drawback due to the dopant segregation during the gate oxide formation or subsequent thermal cycles in the manufacturing processes. Conventional power semiconductor devices are frequently manufactured by forming the body region first then forming the metal gate. The problem of dopant segregation caused by such manufacturing processes leads to a less controllable threshold voltage Vt of the device thus adversely affects the device performance.

Since the semiconductor power devices implemented with metal gate have lower gate resistance, several patent applications have disclosed semiconductor power devices implemented with various metal gates. In US Patent Application 20040137703 a MOSFET threshold voltage tuning is disclosed with metal gate stack control. The metal gate is formed with several metal layers with different thickness to control and tune the gate work functions. The method and device as disclosed however would not provide a solution to the dopant segregation problems.

In Patent Application 20040110097, a double gate semiconductor device with a metal gate is disclosed. The manufacturing method of the device includes the forming a gate structure over a channel portion of a fin structure. The method also includes a step of forming a sacrificial oxide layer around the gate structure and removing the gate structure to define a gate recess within the sacrificial oxide layer. AS metal gate is formed in the gate recess, and the sacrificial oxide layer is removed. In Patent Application 20020084486, a DMOS device is disclosed with metal gate. A sacrificial gate layer is patterned to provide a self-aligned source mask. The source regions are thus aligned to the gate, and the source diffusion provides a slight overlap for good turn-on characteristics and low leakage. The sacrificial gate layer is capable of withstanding the diffusion temperatures of the DMOS process and is selectively etchable. After the high-temperature processing is completed, the sacrificial gate layer is stripped and a gate metal is formed over the substrate, filling the volume left by the stripped sacrificial gate material. In another Patent Application 20020058374, a method of forming dual metal gates in the semiconductor device is disclosed. The method includes the formation of dummy gates in PMOS and NMOS areas and forming the interlayer insulation layer and subsequent processing steps of removing the interlayer insulation layer and the forming of grooves and the dual metal gates and the removal of the dummy gates. However, none of these methods provide practical and cost effective method to resolve the above-discussed problems.

Therefore, a need still exists in the art of power semiconductor device design and manufacture to provide new manufacturing method and device configuration in forming the power devices such that the above discussed problems and limitations can be resolved.

SUMMARY OF THE PRESENT INVENTION

It is therefore an object of the present invention to provide a new and improved semiconductor power device implemented with the split trenched gates where the bottom and top portions of the trenched gate have different work functions to reduced the gate resistance of trench MOSFET of ultra high density in order to overcome the above discussed technical difficulties and limitations.

Specifically, it is an aspect of the present invention to provide improved device configuration and manufacturing method to reduce the gate to drain capacitance while simultaneously reducing the gate resistance and providing more flexible adjustable work functions of the top and bottom portions of the trenched gate in the split trenched gates. The bottom polysilicon segment of the split trenched-gates are insulated by an insulation layer processed with a high temperature densification process from the top portion of a metal gate. The thermal cycles after the metal gate formation may be reduced such that an advantage of preventing a dopant segregation and more accurate control of the threshold voltage is achieved.

It is an aspect of the present invention to provide improved device configuration and manufacturing method to manufacture a MOSFET power device with split trenched gate configuration and meanwhile providing more flexible adjustable work functions of the top and bottom portions of the trenched gate in the split trenched gates. The bottom polysilicon segment of the split trenched-gates has a work function different from the drain work function to optimize the shielding effect and the top portion of a metal gate provides a lower gate resistance with a poly-liner between metal gate and channel having a similar work function as the channel region such that an advantage of precisely adjusting the gate threshold voltage is achieved It is an aspect of the present invention to provide improved device configuration and manufacturing method to manufacture a MOSFET power device with split trenched gate configuration wherein the split trenched gates have at least two separated insulated gate segments each having different work functions such that an advantage of flexibility to adjust work functions of each segment for optimization of device operation at high speed is achieved.

Briefly in a preferred embodiment this invention discloses a trenched metal oxide semiconductor field effect transistor (MOSFET) cell. The trenched MOSFET cell includes a trenched gate opened from a top surface of the semiconductor substrate surrounded by a source region encompassed in a body region above a drain region disposed on a bottom surface of a substrate. The trenched gate further includes at least two mutually insulated trench-filling segments each filled with materials of different work functions. In a preferred embodiment, the trenched gate includes a polysilicon segment at a bottom portion of the trenched gate and a metal segment at a top portion of the trenched gate. In a preferred embodiment, the polysilicon segment at bottom portion of the trenched gate is doped with a dopant to increase a difference in work function between the bottom polysilicon segment at the bottom portion and the drain. In another preferred embodiment, the metal segment at top portion of the trenched gate is surrounded by a poly-liner layer doped with a dopant such that a difference in work function between the poly-liner layer and a channel region insulated by a gate oxide along the poly-liner layer is minimized. In another preferred embodiment, the two mutually insulated trench-filling segments in the trenched gate further comprising a polysilicon segment at a bottom portion of the trenched gate and a metal segment composed of Ti/TiN/W at a top portion of the trenched gate. In another preferred embodiment, the MOSFET device is a N-channel MOSFET device supported on a N-type semiconductor substrate with the source region doped with a N-type dopant and the body region doped with a P-type dopant. In another preferred embodiment, the MOSFET device is a P-channel MOSFET device supported on a P-type semiconductor substrate with the source region doped with a P-type dopant and the body region doped with a N-type dopant. In another preferred embodiment, the two mutually insulated trench-filling segments in the trenched gate are insulated by a HDP oxide layer. In another preferred embodiment, the two mutually insulated trench-filling segments in the trenched gate are insulated by a HTO oxide layer.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1:
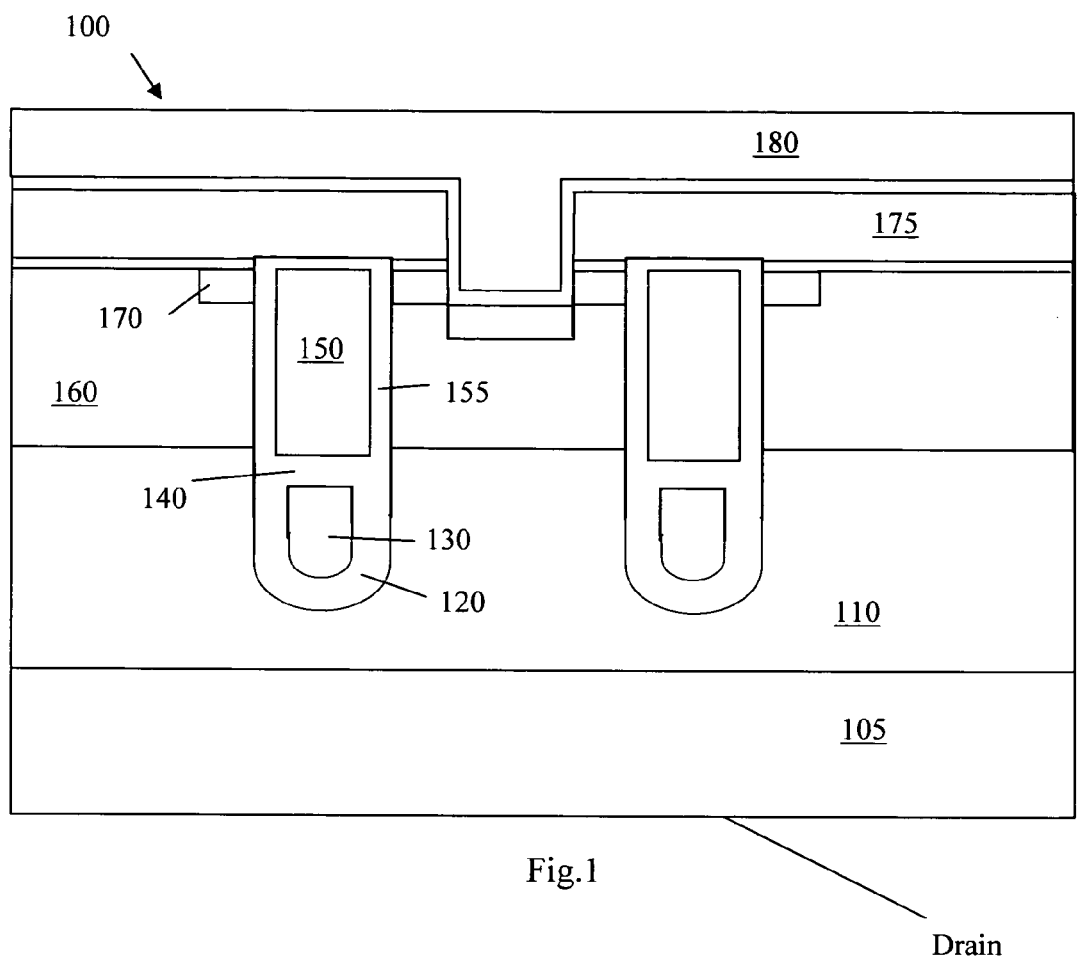
FIG. 1 is a cross sectional view of a trenched MOSFET device implemented with split trenched gate with different gate materials and different work function of this invention.

Referring to FIG. 1 for a cross sectional view of a trenched MOSFET device 100 of this invention. The trenched MOSFET device 100 is supported on a substrate 105 formed with an epitaxial layer 110. The trenched MOSFET device 100 includes a bottom gate segment 130 filled with polysilicon at the bottom portion below a top trenched gate segment 150. The bottom gate segment 130 filled with the polysilicon is shielded and insulated from a top gate segment 150 by an insulation layer 140 disposed between the top and bottom segments. The bottom trenched-segment is also insulated from the drain disposed below 105 by the insulation layers 120 surrounding the bottom surface of the trenched gate. The top trenched gate segment 150 includes metal filling, e.g., Ti/TiN/W layer 150, in a trench surrounded with a gate insulation layer 155 covering the trenched walls. A body region 160 that is doped with a dopant of second conductivity type, e.g., P-type dopant, extends between the trenched gates 150. The P-body regions 160 encompassing a source region 170 doped with the dopant of first conductivity, e.g., N+ dopant. The source regions 170 are formed near the top surface of the epitaxial layer surrounding the trenched gates 150. On the top surface of the semiconductor substrate are also insulation layers 175, contact openings and metal layers 180 for providing electrical contacts to the source-body regions and the gates. For the sake of brevity, these structural features are not shown in details and discussed since those of ordinary skill in the art already know these structures.

Figure 2A:
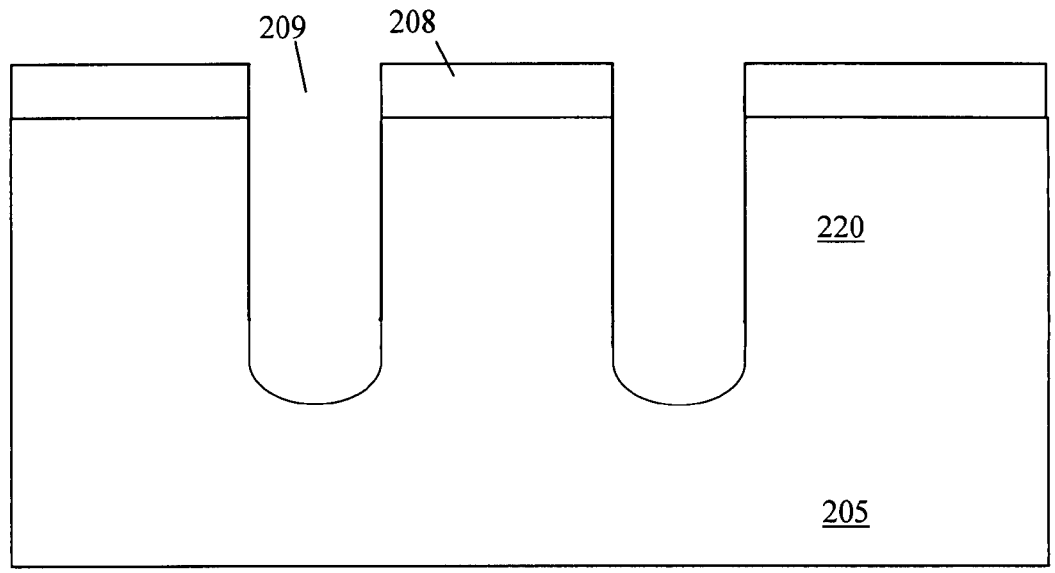
FIGS. 2A to 2I are a serial cross sectional views for describing the manufacturing processes to provide a trenched MOSFET device as shown in FIG. 2.
Figure 2B:
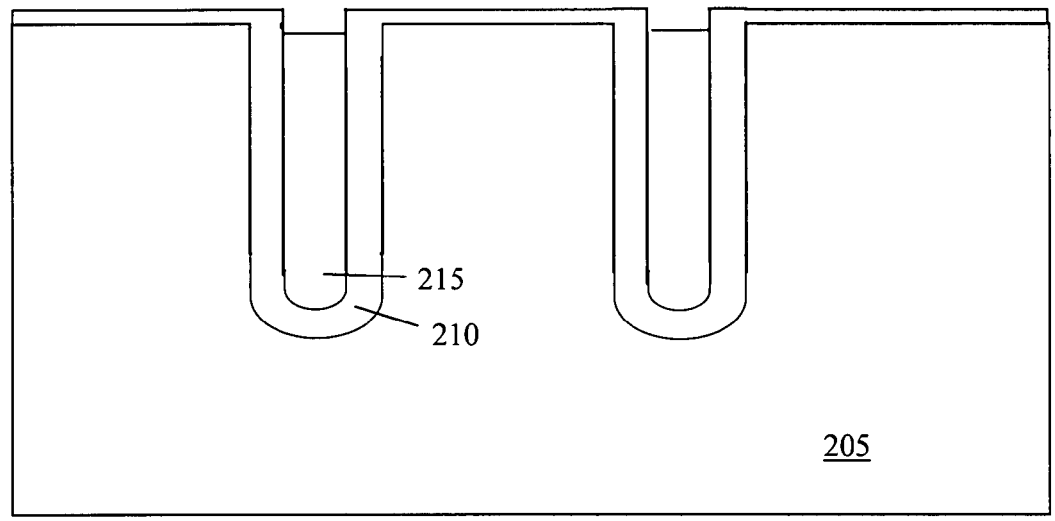
Figure 2C:
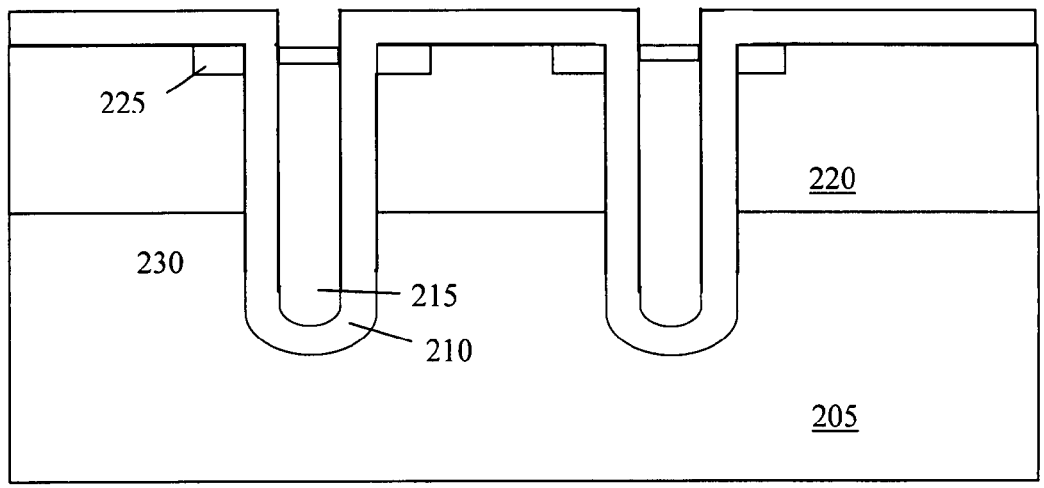

Referring to FIGS. 2A to 2I for a serial of side cross sectional views to illustrate the fabrication steps of a MOSFET device as that shown in FIG. 2. In FIG. 2A, a hard oxide mask 208 is applied to etch and open a plurality of trenches 209 on a substrate 205. In FIG. 2B, the hard oxide mask 208 is removed. A gate oxide layer 210 is grown on the surface of the trench walls and the trench bottom by first applying and etching off a sacrificial gate oxide layer following with the growth of the gate oxide layer 210. Then a polysilicon deposition is performed followed by doping the polysilicon 215 with ion implantation of Phosphor, Boron or POCl3. The dopant is adjusted to maximize the work function difference between the bottom polisilicon segment and the drain region therefore the shielding effect is optimized. Then a polysilicon etch back is carried out to remove the polysilicon from above the trench. In FIG. 2C, a body implant is performed followed by a body diffusion to form the body region 220. Then a source mask (not shown) is applied to carry out a source ion implant followed by a source diffusion to form the source regions 225.

Figure 2D:
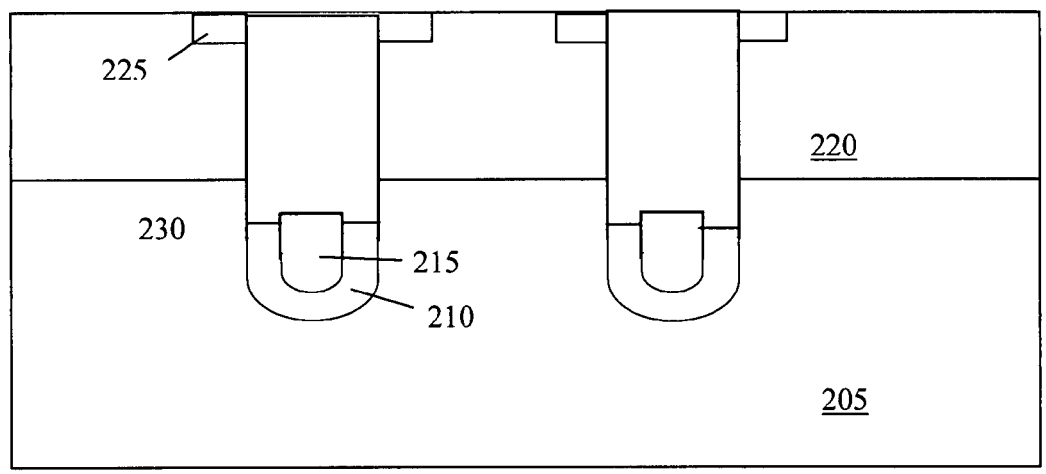
Figure 2E:
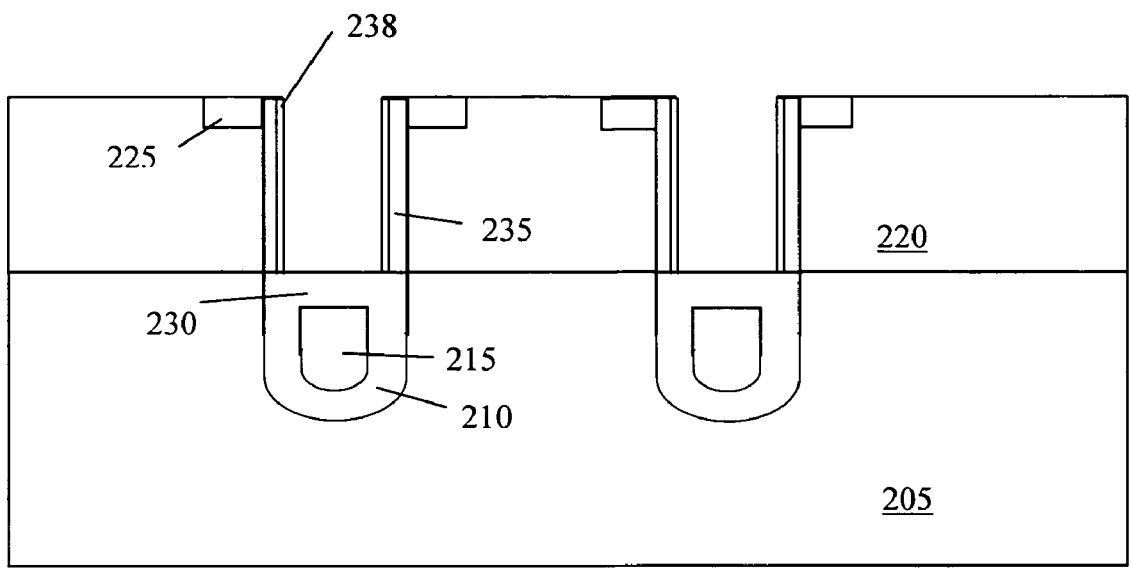
Figure 2F:
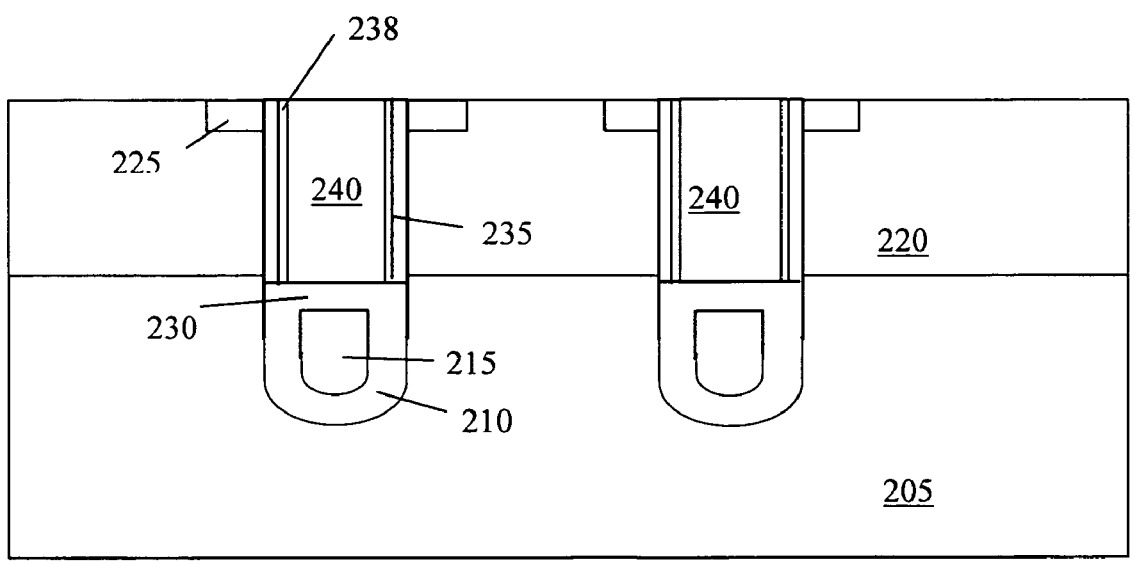
Figure 2G:
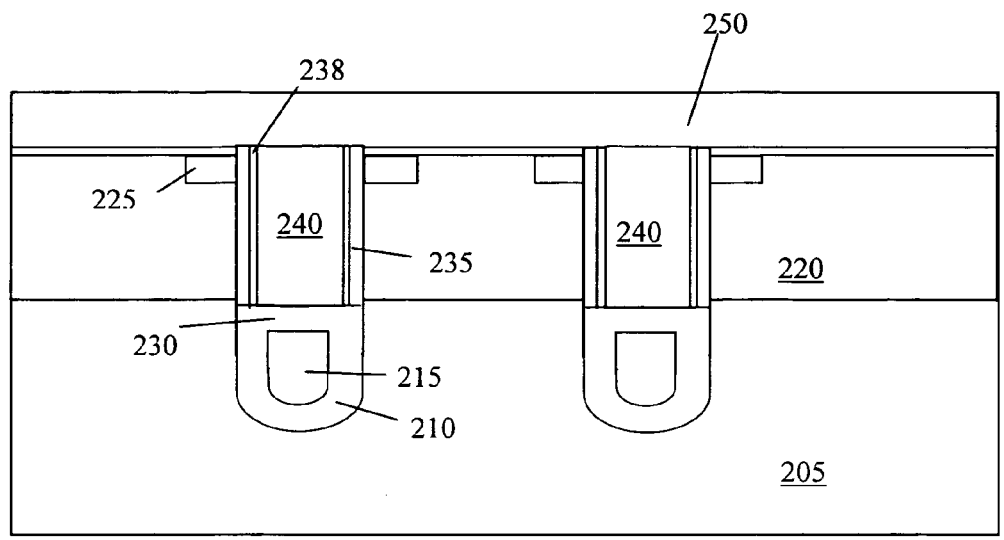
Figure 2H:
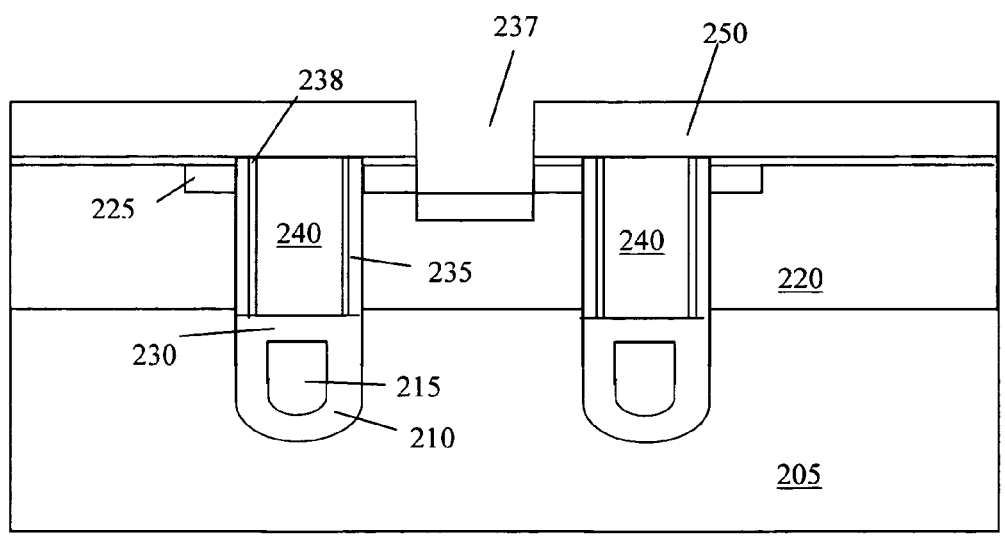
Figure 2I:
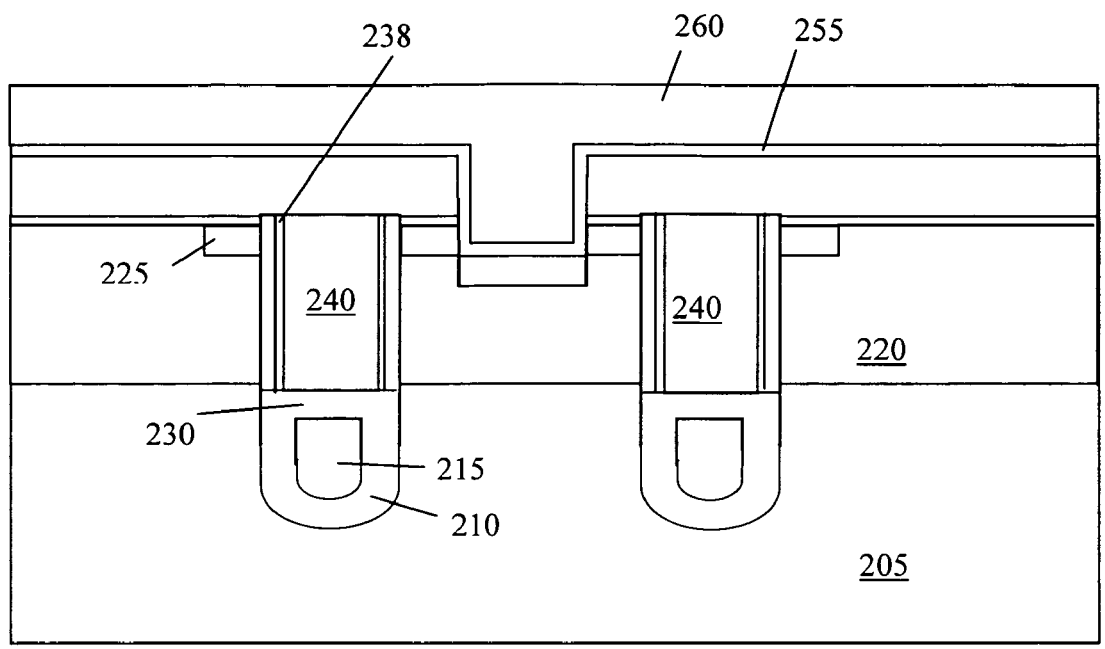

In FIG. 2D, a polysilicon etch back is carried out to remove the top portion of the polysilicon gate 215 from the trenches followed by an oxide etch to remove the oxide layer 210 form the side walls exposed after the polysilicon is removed. In FIG. 2E, a HTO or HDP oxide 230 is deposited. A densification process is carried out to isolate the polysilicon bottom electrode 210 from the top portion of the gate to be filled in the following processing steps. The oxide layer on the sidewalls of the trenches are removed by a wet etch process. In FIG. 2F, a process is carry out by HTO deposition to form a gate oxide layer 235 on the side walls of the trenches without going through traditional high temperature cycle of thermal oxidation to minimize dopant segregation. Alternatively a very thin layer of gate oxide may grow on the side walls of the trenches to a thickness of about 100 A followed by HTO process to complete gate oxide formation. A polysilicon liner layer 238 may be deposited over the gate oxide as an optional processing step to provide the flexibility through dopant adjustment so that the work function is adjusted close to the work function of channel region. This would provide the benefit of more precisely control of gate threshold voltage. Then a chemical vapor deposition (CVD) process is carried out to deposit Ti/TiN/W 240 into the trench followed by removing the Ti/TiN/W metal from about the trenches. An etch-back or a chemical-mechanical planarization (CMP) process is performed to planarize the top surface of the device. Split gates that include a bottom and top portions of different materials are formed. In FIG. 2G, a NSG or BPSG passivation layer 250 is then deposited over the top surface. In FIG. 2H, a contact opening etch is carried out to open the source contact opening 237 and gate contact opening (not shown) through the passivation layer 250. In FIG. 2I, a contact metal layer 260 is deposited over the top surface followed by standard etch process to pattern the contact metal 260 into source metal and gate pad (not shown).

The MOSFET device as described above thus provides a device structure and configuration where the Rg is reduced for small ultra high-density MOSFET cells. The thermal cycles are also reduced after the gate formation. The dissimilar transistor gate work function provides special advantages of adjustments of device performance to satisfy different application specifications. Specifically, the bottom polysilicon gate has a work function different from the drain silicon work function and the top meal gate has a poly-liner that has a similar work function as the drain silicon. Thus significant advantages are provided to maximize the reduction of gate drain capacitance and to precisely adjust the gate threshold voltage.

According to above descriptions, this invention further discloses a method for manufacturing a semiconductor power device. The method includes a step opening and filling a high-temperature sustainable dielectric layer into trenches followed by carrying out processes of implanting and diffusing a body and source regions and removing a top portion of the high-temperature sustainable dielectric layer in the trenches to form a bottom dielectric gate prior to carrying out processes of forming a metal gate on a top portion of the trenches thus minimizing high-temperature cycles applied to the metal gate. In an exemplary embodiment, the method further includes a step of forming an inter-gate insulation layer on top of the bottom dielectric gate before carrying out processes to form the metal gate on top of the inter-gate insulation layer. In another exemplary embodiment, the step of forming bottom dielectric gate comprising forming a bottom polysilicon gate. In an exemplary embodiment, the method further includes a step of forming an inter-gate insulation layer by applying a high temperature oxide (HTO) deposition on top of the bottom dielectric gate before carrying out processes to form the metal gate on top of the inter-gate insulation layer. In an exemplary embodiment, the method further includes a step of forming an inter-gate insulation layer by depositing a high density plasma (HDP) oxide on top of the bottom gate before carrying out processes to form the metal gate on top of the inter-gate insulation layer. In an exemplary embodiment, the method further includes a step of forming an inter-gate insulation layer followed by applying a densification process to further insulate the bottom dielectric gate from the metal gate formed on the top portion of the trenches. In an exemplary embodiment, the step of carrying out processes of forming a metal gate on a top portion of the trenches further comprising applying a chemical vapor deposition (CVD) process for depositing a Ti/TiN/W into the trenches to form the metal gate above the bottom dielectric gate.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A trenched metal oxide semiconductor field effect transistor (MOSFET) device comprising a trenched gate surrounded by a source region encompassed in a body region above a drain region disposed on a bottom surface of a substrate, wherein said MOSFET cell further comprising:
said trenched gate further includes at least two mutually insulated trench-filling segments each filled with materials of different work functions;
said two mutually insulated trench-filling segments in said trenched gate further comprising a polysilicon segment at a bottom portion of the trenched gate and a metal segment at a top portion of the trenched gate; and
said metal segment at the top portion of the trenched gate is surrounded by a poly-liner layer doped with a dopant to adjust a difference in work function between said poly-liner layer and a channel region insulated by a gate oxide along said poly-liner layer.

2. The MOSFET device of claim 1 wherein:
said polysilicon segment at the bottom portion of the trenched gate is doped with a dopant such that a difference in work function between said bottom polysilicon segment at the bottom portion of the trenched gate and said drain is maximized.

3. The MOSFET device of claim 1 wherein:
said two mutually insulated trench-filling segments in said trenched gate further comprising a polysilicon segment at a bottom portion of the trenched gate and a metal segment composed of Ti/TiN/W at a top portion of the trenched gate.

4. The MOSFET device of claim 1 wherein:
said MOSFET device is a N-channel MOSFET device supported on a N-type semiconductor substrate with said source region doped with a N-type dopant and said body region doped with a P-type dopant.

5. The MOSFET device of claim 1 wherein:
said MOSFET device is a P-channel MOSFET device supported on a P-type semiconductor substrate with said source region doped with a P-type dopant and said body region doped with a N-type dopant.

6. The MOSFET device of claim 1 wherein:
said two mutually insulated trench-filling segments in said trenched gate are insulated by a HDP oxide layer.

7. The MOSFET device of claim 1 wherein:
said two mutually insulated trench-filling segments in said trenched gate are insulated by a HTO oxide layer.

8. A semiconductor power device comprising:
a trenched gate disposed in a semiconductor substrate further includes at least two mutually insulated trench-filling segments each filled with materials of different work functions; and
said metal segment at a top portion of the trenched gate is surrounded by a poly-liner layer doped with a dopant to adjust a difference in work function between said poly-liner layer and a channel region insulated by a gate oxide along said poly-liner layer.

9. The semiconductor power device of claim 8 wherein:
said two mutually insulated trench-filling segments in said trenched gate further comprising a polysilicon segment at a bottom portion of the trenched gate and a metal segment at the a top portion of the trenched gate.

10. The semiconductor power device of claim 9 wherein:
said polysilicon segment at the bottom portion of the trenched gate is doped with a dopant for increasing a difference in work function between said polysilicon segment at the bottom portion of the trenched gate and a drain region disposed on a bottom surface of said semiconductor substrate.

11. The semiconductor power device of claim 8 wherein:
said two mutually insulated trench-filling segments in said trenched gate further comprising a polysilicon segment at a bottom portion of the trenched gate and a metal segment composed of Ti/TiN/W at the a top portion of the trenched gate.

12. The semiconductor power device of claim 8 wherein:
said semiconductor power device comprises a trenched MOSFET device with said trenched gate surrounded by a source region encompassed in a body region above a drain region disposed on a bottom surface of said semiconductor substrate.

13. The semiconductor power device of claim 12 wherein:
said MOSFET device is a N-channel MOSFET device supported on a N-type semiconductor substrate with said source region doped with a N-type dopant and said body region doped with a P-type dopant.

14. The semiconductor power device of claim 12 wherein:
said MOSFET device is a P-channel MOSFET device supported on a P-type semiconductor substrate with said source region doped with a P-type dopant and said body region doped with a N-type dopant.

* * * * *